(12) United States Patent
Lin et al.

(10) Patent No.: US 7,714,608 B1
(45) Date of Patent: *May 11, 2010

(54) TEMPERATURE-INDEPENDENT, LINEAR ON-CHIP TERMINATION RESISTANCE

(75) Inventors: Mou C. Lin, High Bridge, NJ (US); William B. Andrews, Emmaus, PA (US); John A. Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/370,039

(22) Filed: Feb. 12, 2009

Related U.S. Application Data

(63) Continuation of application No. 11/300,886, filed on Dec. 15, 2005, now Pat. No. 7,495,467.

(51) Int. Cl.
*H03K 17/16* (2006.01)
(52) U.S. Cl. .............................. 326/32; 326/30; 326/26; 326/27; 326/29
(58) Field of Classification Search .................. 326/30, 326/21; 327/108
See application file for complete search history.

(56) References Cited

U.S. PATENT DOCUMENTS

| | | | | |
|---|---|---|---|---|
| 2003/0094991 A1* | 5/2003 | Mughal et al. | ............... | 327/378 |
| 2003/0112050 A1* | 6/2003 | Mughal et al. | ............... | 327/334 |
| 2003/0218477 A1* | 11/2003 | Jang et al. | ....................... | 326/30 |
| 2004/0004494 A1* | 1/2004 | Song | ............................. | 326/30 |
| 2005/0040845 A1* | 2/2005 | Park | ............................. | 326/30 |
| 2005/0134303 A1* | 6/2005 | Best et al. | ...................... | 326/30 |
| 2006/0166457 A1* | 7/2006 | Liu et al. | ..................... | 438/400 |

* cited by examiner

*Primary Examiner*—Vibol Tan

(57) ABSTRACT

In one embodiment, an integrated circuit, such as an FPGA, has one or more programmable termination schemes, each having a plurality of resistive termination legs connected in parallel, and a calibration circuit designed to control each termination scheme for process, voltage, and temperature (PVT) variations. A sense element in the calibration circuit and each resistive leg in each termination scheme has a transistor-based transmission gate connected in series with a non-silicided poly (NSP) resistor. The negative temperature coefficient of resistivity of each NSP resistor offsets the positive temperature coefficient of resistivity of the corresponding transmission gate to provide a temperature-independent sense element and temperature-independent termination legs. The temperature-independence and constant IV characteristic of the sense element and termination legs enable a single calibration circuit to simultaneously control multiple termination schemes operating at different termination voltage levels.

15 Claims, 3 Drawing Sheets

US 7,714,608 B1

TEMPERATURE-INDEPENDENT, LINEAR ON-CHIP TERMINATION RESISTANCE

RELATED APPLICATION DATA

This application is a continuation of U.S. patent application Ser. No. 11/300,886, filed Dec. 15, 2005, which is incorporated herein in its entirety.

TECHNICAL FIELD

The present invention relates to electronics, and, in particular, to input/output (I/O) interfaces for integrated devices.

BACKGROUND

Signal integrity has become a critical issue in the design of high-speed chip-to-chip communications systems. Using the proper termination scheme can be critical to maintaining good signal integrity. Improper terminations can lead to poor quality due to reflections or signal attenuation. On-chip termination can eliminate the need for external termination resistors on the board, thereby avoiding signal reflections caused by stubs between an on-chip buffer and an off-chip termination resistor.

Unfortunately, in high-speed operations, signals can be distorted as a result of non-linearities in the IV (current-voltage) curve of the on-chip termination resistance. In differential I/O signaling, non-linearity can contribute to different edge rates between the pair of signals, which can adversely impact timing and reduce the data valid window. In addition, conventional on-chip termination schemes are susceptible to process, voltage, and temperature (PVT) variations. As a result, the termination resistance levels will typically vary over different PVT conditions.

As a particular technology matures, process variations usually decrease sufficiently to enable acceptable implementation of on-chip termination. However, the resistance of on-chip termination resistors can vary by 10% to 60% across a temperature range of operation of −40 C to +125 C, especially in termination schemes that use transistors as the resistive elements. In addition to their wide variations in resistance with respect to temperature, transistors also have inherent non-linearities in their IV curves. Both of these characteristics make it very difficult to control the accuracy and constancy of on-chip impedances implemented using transistors. To compensate for such wide variations in resistance as a function of temperature, elaborate PVT calibration circuits are typically employed to control the configuration of programmable, on-chip termination schemes used for I/O buffers. These calibration circuits increase the complexity of the I/O buffers and require additional layout area.

Moreover, in certain applications, such as in field-programmable gate arrays (FPGAs), I/O buffer modes that operate at different power supply voltage levels are frequently deployed on a single chip. Because of the non-linearity of the IV curve of the on-chip impedance, a separate PVT calibration circuit may need to be implemented for each different voltage level and/or each different I/O bank, since the calibration circuit for one voltage level will typically not properly calibrate the on-chip impedance used for a different voltage level. Implementing multiple calibration circuits, each of which may require one or more pads and may need to be placed close to its associated I/O bank, increases die size and reduces the number of pads that can be used as I/O signal pads.

SUMMARY

In one aspect of the invention, an integrated circuit comprises a termination scheme having a plurality of legs each comprising a first resistive element having a positive temperature coefficient of resistivity connected in series to a second resistive element having a negative temperature coefficient of resistivity, the legs connected in parallel between a termination voltage and a pad; and a calibration circuit adapted to generate corresponding temperature-independent control signals for selectively turning on or off corresponding legs in the termination scheme to set a net resistance of the termination scheme.

In another aspect of the invention, an integrated circuit comprises a termination scheme having a plurality of legs, each leg having a substantially zero temperature coefficient of resistivity, the legs connected in parallel between a termination voltage and a pad; and a calibration circuit adapted to generate corresponding temperature-independent control signals for selectively turning on or off corresponding legs in the termination scheme to set a net resistance of the termination scheme.

In yet another aspect of the invention, an integrated circuit comprises a termination scheme having a plurality of substantially temperature-independent resistive legs, the legs connected in parallel between a termination voltage and a pad; and a calibration circuit adapted to generate corresponding temperature-independent control signals for selectively turning on or off corresponding legs in the termination scheme to set a net resistance of the termination scheme.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

FPGA Architecture

Figure 1:
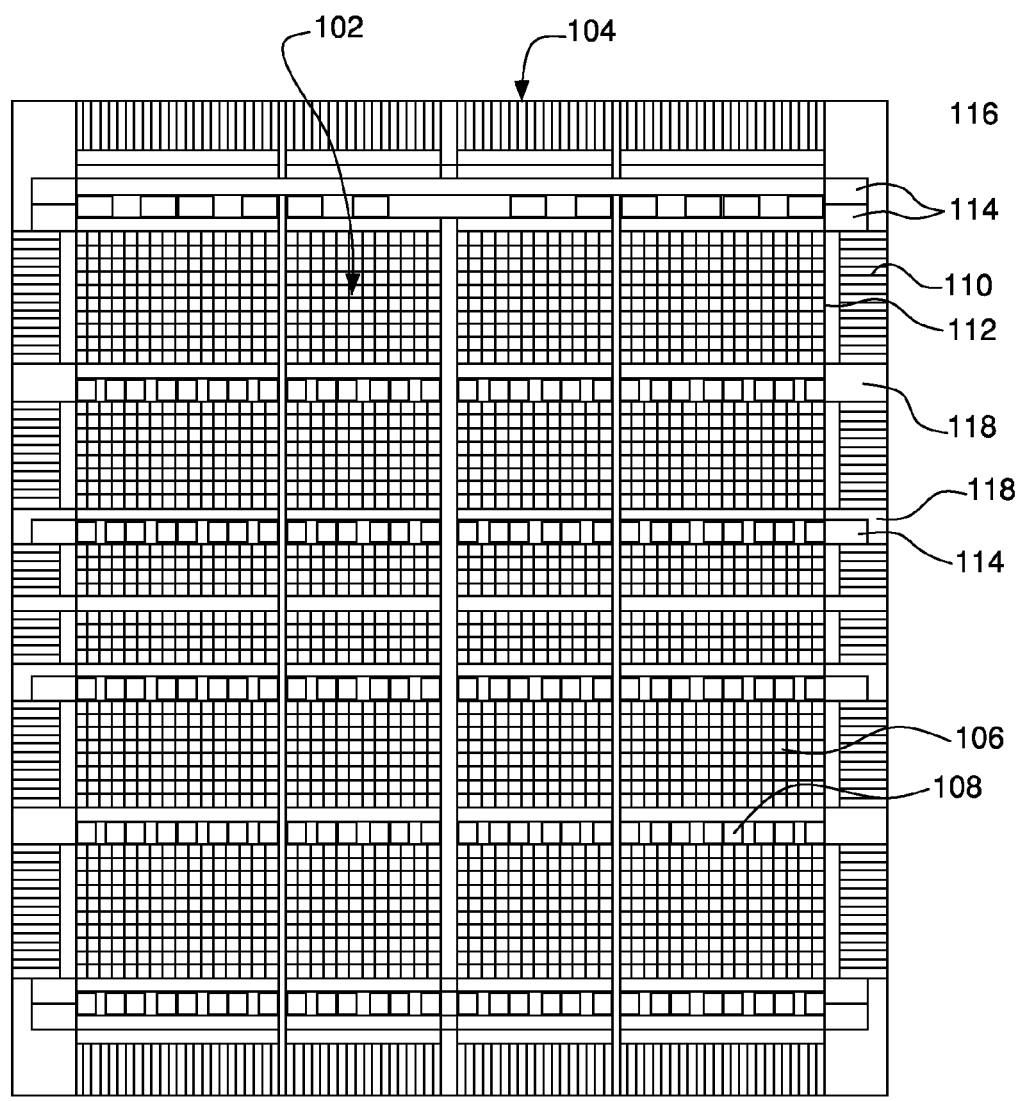
FIG. 1 shows a high-level block diagram of the layout of an exemplary FPGA of the present invention.

FIG. 1 shows a high-level block diagram of the layout of an exemplary FPGA 100 of the present invention, having a logic core 102 surrounded by an input/output (I/O) ring 104. Logic core 102 includes an array of programmable logic blocks (PLBs) 106 (also known by other names such as configurable logic blocks or logic array blocks) intersected by rows of block memory 108. Each PLB contains circuitry that can be programmed to perform a variety of different functions. The memory blocks in each row are available to store data to be input to the PLBs and/or data generated by the PLBs. I/O ring 104 includes sets of I/O buffers 110 programmably connected to the logic core by multiplexor/demultiplexor (mux/demux) circuits 112. The I/O buffers support external interfacing to FPGA 100. Also located within the I/O ring are a number of phase-locked loop (PLL) circuits 114 that are capable of providing different timing signals for use by the various elements within FPGA 100. Those skilled in the art will understand that FPGAs, such as FPGA 100, will typically include other elements, such as configuration memory, that are not shown in the high-level block diagram of FIG. 1. In addition, general routing resources, including clocks, buses, general-purpose routing, high-speed routing, etc. (also not shown in FIG. 1), are provided throughout the FPGA layout to programmably interconnect the various elements within FPGA 100.

The layout of an FPGA, such as FPGA 100 of FIG. 1, comprises multiple instances of a limited number of different types of blocks of circuitry. For example, an I/O ring may contain a number of instances of the same basic block of circuitry repeated around the periphery of the device. In the example of FPGA 100, I/O ring 104 is made up of multiple instances of the same basic programmable I/O circuit (PIC), where each PIC provides a particular number of the I/O buffers of the I/O ring.

Programmable Termination Scheme

Figure 2:
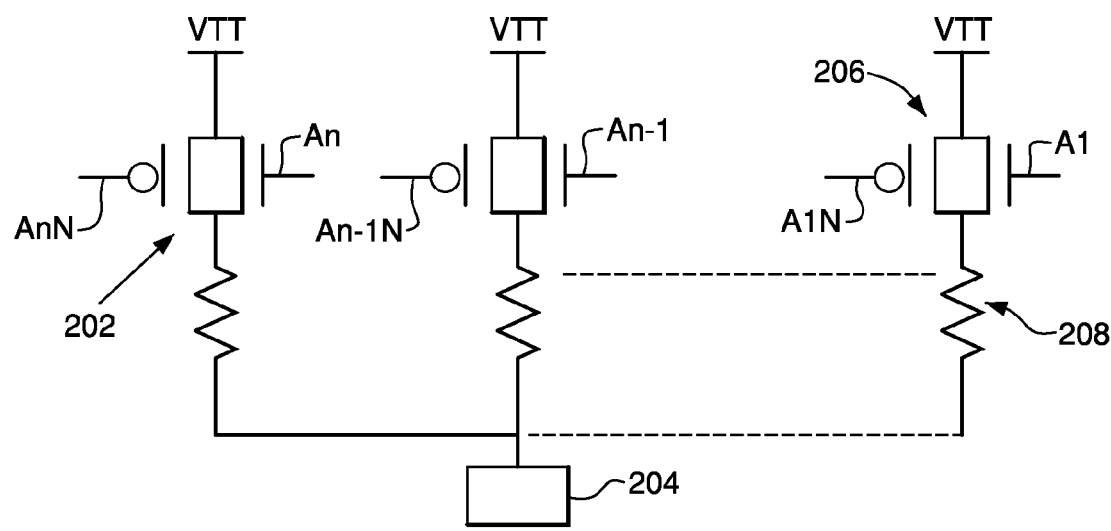
FIG. 2 shows a schematic circuit diagram of a programmable termination scheme according to one embodiment of the present invention.

FIG. 2 shows a schematic circuit diagram of a programmable termination scheme 200, according to one embodiment of the present invention. Instances of programmable termination scheme 200 may be employed, for example, in one or more I/O buffers of FPGA 100 of FIG. 1.

As shown in FIG. 2, termination scheme 200 comprises n termination legs 202 connected in parallel between the termination voltage VTT and pad 204, where each leg 202 comprises a transistor-based transmission gate 206 connected in series with an n-type or p-type non-silicided poly (NSP) resistor 208. The transmission gate of the ith leg is controlled by two 1-bit digital control signals: Ai and its complement AiN. In general, if Ai is high, then AiN is low and the ith transmission gate is on (i.e., its closed-switch state). Similarly, if Ai is low, then AiN is high and the ith transmission gate is off (i.e., its open-switch state). If its transmission gate is on, then the effective resistance of the ith leg affects the net resistance of termination scheme 200. On the other hand, if its transmission gate is off, then the ith leg does not affect the net resistance of termination scheme 200.

By selectively turning on different numbers of transmission gates using control signals Ai and AiN, the net resistance of termination scheme 200 can be varied in a controlled manner. In one possible implementation, the dimensions of each NSP resistor 208 and of the transistors in each transmission gate 206 are selected such that the (minimum available) net resistance of termination scheme 200 with all of the transmission gates turned on matches the resistance value for the worst-case slow PVT condition. Turning off one or more transmission gates provides higher and higher net resistance levels for termination scheme 200, as will be appropriate for other (i.e., faster) PVT conditions.

Figure 3:
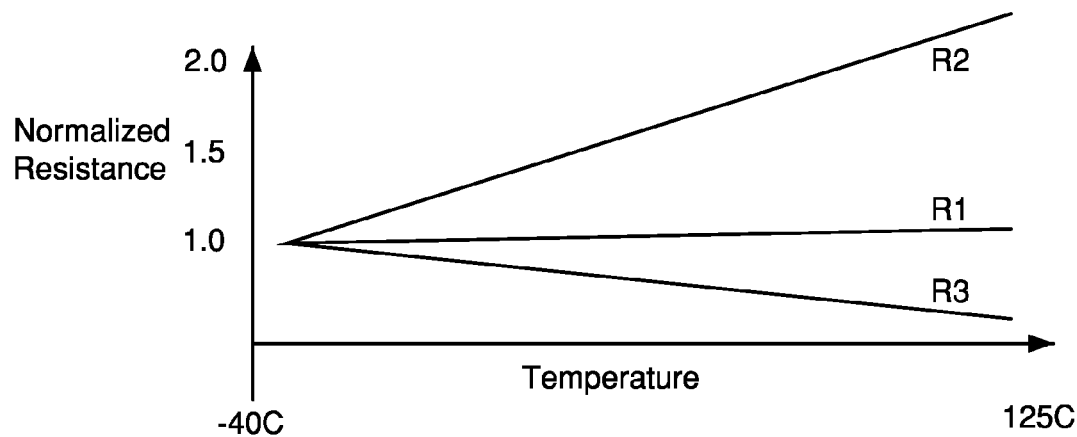
FIG. 3 graphically represents the relationship between temperature and resistance for each transistor-based transmission gate (curve R2), each non-silicided poly resistor (curve R3), and each leg of the termination scheme (curve R1) of FIG. 2.

FIG. 3 graphically represents the relationship between temperature and resistance for each transistor-based transmission gate 206 (curve R2), each non-silicided poly resistor 208 (curve R3), and each leg 202 of termination scheme 200 (curve R1) of FIG. 2. As indicated by curve R2, the resistance of transmission gate 206 increases with temperature (i.e., the temperature coefficient of resistivity of transmission gate 206 is positive). However, due to the transport properties of NSP resistors and as indicated by curve R3, the resistance of NSP resistor 208 decreases with temperature (i.e., the temperature coefficient of resistivity of NSP resistor 208 is negative). By appropriately selecting the dimensions of the transistors used to implement transmission gate 206 and the dimensions of NSP resistor 208, leg 202 can be designed such that its resistance is substantially temperature-independent (e.g., less than 1-2% variation) over the temperature range of −40 C to +125 C (i.e., the effective temperature coefficient of resistivity of the leg is substantially zero), as indicated by curve R1. Moreover, each leg 202 will have a substantially linear IV characteristic.

Figure 4:
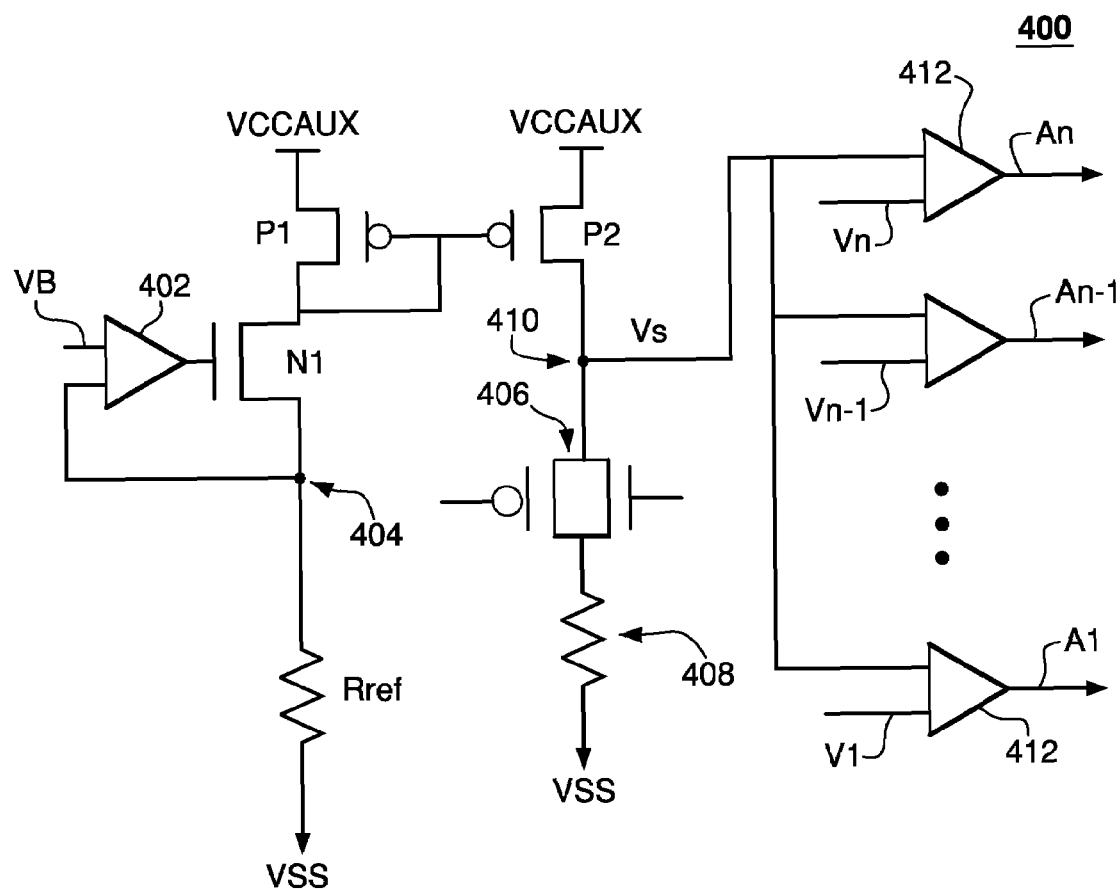
FIG. 4 shows a schematic circuit diagram of a PVT calibration circuit used to generate the 1-bit control signals Ai and AiN used to configure the programmable termination scheme of FIG. 2.

FIG. 4 shows a schematic circuit diagram of a PVT calibration circuit 400 used to generate the 1-bit control signals Ai and AiN used to configure programmable termination scheme 200 of FIG. 2. Calibration circuit 400 adjusts the control signals for variations in process, voltage, and temperature to provide PVT-control to termination scheme 200. Moreover, since each leg of termination scheme 200 has a substantially linear IV characteristic, a single calibration circuit 400 can be used to simultaneously control two or more different on-chip instances of termination scheme 200 operating at the same or even different termination voltage levels.

As shown in FIG. 4, voltage amplifier 402 receives input voltage VB (e.g., from an on-chip resistor tree) and a feedback voltage signal from node 404 and generates a stable voltage level at the gate of NFET device N1 that keeps device N1 turned on. In one possible implementation, Rref is an off-chip resistor. In that case, node 404 corresponds to a pad on the chip, where off-chip resistor Rref is connected between that pad and reference voltage VSS (e.g., ground). Alternatively, resistor Rref could be implemented on-chip.

Turning device N1 on pulls the voltages at the gates of PFET devices P1 and P2 low, thereby turning on devices P1 and P2, where the current through device P1 is mirrored through device P2. The on-chip sense element (Rsense) for calibration circuit 400 corresponds to the series combination of transmission gate 406 and resistor 408, which are preferably implemented using the identical types of devices as those used to implement each transistor-based transmission gate 206 and each NSP resistor 208, respectively, in termination scheme 200 of FIG. 2. In this way, sense element Rsense should have substantially identical PVT characteristics as those of each leg in termination scheme 200.

With transmission gate 406 turned on, a sense voltage Vs at node 410 is generated and applied to one input of each of n comparators 412. In addition, each comparator 412 receives a different reference voltage Vi (e.g., from an on-chip resistor tree), with levels ranging from just above VSS to just below VCCAUX, e.g., in uniform intervals. If sense voltage Vs is greater than reference voltage Vi, then the output Ai of the corresponding ith comparator will be high; otherwise, Ai will be low.

Like each leg in termination scheme 200, sense element Rsense in calibration circuit 400 is substantially temperature-independent. As such, sense voltage Vs is also substantially temperature-independent. As a result, if a temperature-insensitive circuit is used to generate the reference voltages, then control signals Ai will also be substantially temperature-independent. By properly adjusting the reference voltages Vi based on the variation of sense voltage Vs with respect to process variations, calibration circuit 400 can configure programmable termination scheme 200 of FIG. 2 to less than 10% variation with respect to typical ranges of PVT conditions.

The present invention has been described in the context of a programmable on-chip termination scheme having a resistor array consisting of a plurality of termination legs connected in parallel, where each leg consists of a transistor-based transmission gate connected in series with a non-silicided poly resistor, where the transmission gate has a positive temperature coefficient of resistivity, the poly resistor decreases has a negative temperature coefficient of resistivity, and the sizes of the devices are selected to provide the leg with a temperature coefficient of resistivity of substantially zero. In general, embodiments of termination schemes of the present invention can be implemented having other characteristics, such as one or more of the following:

- Any number of resistor legs, including as few as one (e.g., for a non-programmable termination scheme);
- Resistive elements having a positive temperature coefficient of resistivity, other than transistor-based transmission gates, such as other transistor-based devices or even non-transistor-based devices;
- Resistive elements having a negative temperature coefficient of resistivity, other than non-silicided poly resistors;
- Each resistor leg comprising one or more resistive elements having a positive temperature coefficient of resistivity and one or more resistive elements having a negative temperature coefficient of resistivity, where the resistive elements are not necessarily all connected in series; and
- The resistive elements in each resistor leg are selected to achieve an effective temperature coefficient of resistivity other than zero, including different resistor legs possibly having different effective temperature coefficients of resistivity.

Although the present invention has been described in the context of FPGAs, those skilled in the art will understand that the present invention can be implemented in the context of other types of devices, such as, without limitation, application-specific integrated circuits (ASICs), programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit comprising:
   a termination scheme having a plurality of legs each comprising a first resistive element having a positive temperature coefficient of resistivity connected in series to a second resistive element having a negative temperature coefficient of resistivity, the legs connected in parallel between a termination voltage and a pad; and
   a calibration circuit adapted to generate corresponding temperature-independent control signals for selectively turning on or off corresponding legs in the termination scheme to set a net resistance of the termination scheme;
   wherein the calibration circuit is further adapted to generate a temperature-independent sense voltage, the calibration circuit including a plurality of comparators for comparing the sense voltage with different reference voltages to generate the corresponding temperature-independent control signals based on the relative levels of the sense voltage and each reference voltage.

2. The integrated circuit of claim 1, wherein one of the first resistive element and second resistive element is a transistor-based gate adapted to be turned on or off by a temperature-independent control signal from the calibration circuit.

3. The integrated circuit of claim 1, wherein the first resistive element is a transistor-based gate adapted to be turned on or off by a temperature-independent control signal from the calibration circuit.

4. The integrated circuit of claim 1, wherein the second resistive element is a non-silicided poly (NSP) resistor.

5. The integrated circuit of claim 1, wherein each of the legs has a substantially zero temperature coefficient of resistivity.

6. The integrated circuit of claim 1, wherein the calibration circuit includes a first resistive element having a positive temperature coefficient of resistivity and a second resistive element having a negative coefficient of resistivity for generating the temperature-independent control signals.

7. An integrated circuit comprising:
   a termination scheme having a plurality of legs, each leg having a substantially zero temperature coefficient of resistivity, the legs connected in parallel between a termination voltage and a pad; and
   a calibration circuit adapted to generate corresponding temperature-independent control signals for selectively turning on or off corresponding legs in the termination scheme to set a net resistance of the termination scheme;
   wherein the calibration circuit is further adapted to generate a temperature-independent sense voltage, the calibration circuit including a plurality of comparators for comparing the sense voltage with different reference voltages to generate the corresponding temperature-independent control signals based on the relative levels of the sense voltage and each reference voltage.

8. The integrated circuit of claim 7, wherein each leg comprises a transistor-based gate having a positive temperature coefficient of resistivity connected in series to a resistor having a negative temperature coefficient of resistivity, the transistor-based gate adapted to be turned on or off by a temperature-independent control signal from the calibration circuit.

9. The integrated circuit of claim 7, wherein the calibration circuit includes a sense element having a substantially zero temperature coefficient of resistivity for generating the temperature-independent control signals.

10. The integrated circuit of claim 9, wherein the sense element comprises a first resistive element having a positive temperature coefficient of resistivity and a second resistive element having a negative coefficient of resistivity.

11. An integrated circuit comprising:
a termination scheme having a plurality of substantially temperature-independent resistive legs, the legs connected in parallel between a termination voltage and a pad; and
a calibration circuit adapted to generate corresponding temperature-independent control signals for selectively turning on or off corresponding legs in the termination scheme to set a net resistance of the termination scheme
wherein the calibration circuit is further adapted to generate a temperature-independent sense voltage, the calibration circuit including a plurality of comparators for comparing the sense voltage with different reference voltages to generate the corresponding temperature-independent control signals based on the relative levels of the sense voltage and each reference voltage.

12. The integrated circuit of claim 11, wherein the calibration circuit includes a sense element having a substantially zero temperature coefficient of resistivity for generating the temperature-independent control signals.

13. The integrated circuit of claim 12, wherein the sense element comprises a first resistive element having a positive temperature coefficient of resistivity and a second resistive element having a negative coefficient of resistivity.

14. An integrated circuit comprising:
a programmable termination scheme; and
a calibration circuit adapted to generate a temperature-independent control signal for configuring the termination scheme;
wherein the calibration circuit includes an on-chip sense element for generating a temperature-independent sense voltage for the temperature-independent control signal, the on-chip sense element including a first resistive element having a positive temperature coefficient of resistivity and a second resistive element having a negative coefficient of resistivity.

15. The integrated circuit of claim 14, wherein the calibration circuit is adapted to generate a temperature-independent sense voltage, and the calibration circuit includes at least one comparator for comparing the temperature-independent sense voltage with a reference voltage to generate at least one temperature-independent control signal based on the relative levels of the temperature-independent sense voltage and the reference voltage.

* * * * *